(12) United States Patent
Johnson et al.

(10) Patent No.: US 12,736,577 B2
(45) Date of Patent: Sep. 15, 2026

(54) CONTACTOR FOR VOLTAGE ISOLATION AND BREAKDOWN TESTING

(71) Applicant: Boston Semi Equipment LLC, Billerica, MA (US)

(72) Inventors: Stephen Johnson, Arden Hills, MN (US); Daniel Mariano, Abington, MA (US); David Ostendorf, Hudson, WI (US)

(73) Assignee: Boston Semi Equipment LLC, Billerica, MA (US)

( * ) Notice: Subject to any disclaimer, the term of this patent is extended or adjusted under 35 U.S.C. 154(b) by 147 days.

(21) Appl. No.: 18/642,715

(22) Filed: Apr. 22, 2024

(65) Prior Publication Data

US 2024/0353467 A1 Oct. 24, 2024

Related U.S. Application Data

(60) Provisional application No. 63/497,822, filed on Apr. 24, 2023.

(51) Int. Cl.
*H01H 31/12* (2006.01)
*G01R 31/16* (2006.01)

(52) U.S. Cl.
CPC .................................... *G01R 31/16* (2013.01)

(58) Field of Classification Search
CPC ..... G01R 31/16; G01R 31/129; G01R 1/0466
See application file for complete search history.

(56) References Cited

U.S. PATENT DOCUMENTS

| | | | | |
|---|---|---|---|---|
| 3,775,686 A | 11/1973 | Ganger et al. | | |
| 2008/0106206 A1* | 5/2008 | Hooke | H01J 37/32348 | 315/111.21 |
| 2009/0152958 A1* | 6/2009 | Brown | F15B 15/14 | 310/12.24 |

(Continued)

FOREIGN PATENT DOCUMENTS

| | | |
|---|---|---|
| CN | 102313864 A | 1/2012 |
| CN | 103809085 A | 5/2014 |

(Continued)

OTHER PUBLICATIONS

Communication pursuant to Article 94(3) EPC in EP Application No. 24 172 046.5-1101 mailed Apr. 10, 2024 (9 pgs).

*Primary Examiner* — Thang X Le
(74) *Attorney, Agent, or Firm* — Nixon Peabody LLP

(57) ABSTRACT

A contactor and method for testing a breakdown voltage of a device are disclosed. The contactor includes a test site including a plurality of electrical contacts configured to make an electrical connection with the device when the device is positioned at the test site. The contactor further includes a housing including a first housing portion and a second housing portion. The first housing portion and the second housing portion are configured to selectively engage and disengage from each other. The first housing portion and the second housing portion define a closed chamber when engaged, with the test site being within the closed chamber. The contactor further includes a gas inlet configured to supply pressurized gas for pressurizing the closed chamber when the first housing portion and the second housing portion are engaged.

19 Claims, 13 Drawing Sheets

(56) References Cited

U.S. PATENT DOCUMENTS

| | | | | |
|---|---|---|---|---|
| 2011/0309850 | A1* | 12/2011 | Yoshida | G01R 31/129 324/750.14 |
| 2019/0033343 | A1* | 1/2019 | Genkin | G01R 31/26 |
| 2022/0122873 | A1* | 4/2022 | Li | H01J 37/32715 |

FOREIGN PATENT DOCUMENTS

| | | | |
|---|---|---|---|
| CN | 113917196 | A | 1/2022 |
| CN | 115684678 | A | 2/2023 |
| DE | 2132928 | A1 | 12/1972 |
| EP | 2411820 | B1 | 6/2015 |
| JP | S63273073 | A | 11/1988 |
| JP | 2014070981 | A | 4/2014 |
| JP | 5771564 | B2 | 9/2015 |
| JP | 6504971 | B2 | 4/2019 |

* cited by examiner

CONTACTOR FOR VOLTAGE ISOLATION AND BREAKDOWN TESTING

CROSS-REFERENCE TO RELATED APPLICATIONS

The present application claims priority to and the benefit of U.S. Provisional Application No. 63/497,822, filed Apr. 24, 2023, and entitled "CONTACTOR FOR VOLTAGE ISOLATION AND BREAKDOWN TESTING," the contents of which are hereby incorporated by reference herein in their entirety.

FIELD OF THE INVENTION

The present invention relates generally to devices and methods for testing breakdown voltage, and more specifically, to a contactor with a pressurized chamber for testing breakdown voltage, and an associated method.

BACKGROUND OF THE INVENTION

Contactors are apparatuses used in the semiconductor industry for applying a voltage across a device to perform voltage isolation and breakdown testing, which is particularly critical for semiconductor devices. Paschen's law states that breakdown voltage is a function of pressure and increases at elevated pressures relative to ambient pressure. Similarly, breakdown voltage increases at elevated degrees of vacuum relative to ambient pressure. However, no conventional contactor takes advantage of the benefits of conducting voltage isolation and breakdown testing at pressures other than generally ambient pressure.

Accordingly, needs exist for contactors and associated methods for conducting voltage isolation and breakdown testing at pressures other than generally ambient pressure.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a contactor is disclosed for applying a test voltage across a device. The contactor includes a test site including a plurality of electrical contacts configured to make an electrical connection with the device when the device is positioned at the test site. The contactor further includes a housing including a first housing portion and a second housing portion. The first housing portion and the second housing portion are configured to selectively engage and disengage from each other. The first housing portion and the second housing portion define a closed chamber when engaged, with the test site in the closed chamber. The contactor also includes a gas inlet configured to supply pressurized gas for pressurizing the closed chamber when the first housing portion and the second housing portion are engaged.

According to certain further aspects, the first housing portion and the second housing portion are made of a material that is inflexible. The contactor further includes a gasket configured to form a seal between the first housing portion and the second housing portion when engaged with each other.

According to certain further aspects, the contactor includes a test ledge configured to actuate between a first position, configured to hold the device at the test site, and a second position, configured to release the device from the test site. The test ledge extends through one of the first housing portion or the second housing portion. The contactor also includes a gasket configured to form a seal between the test ledge and the one of the first housing portion or the second housing portion that the test ledge extends through.

According to certain further aspects, the second housing portion includes a plurality of segments. The contactor further includes one or more gaskets. Each gasket of the one or more gaskets is configured to form a seal between an adjacent pair of the plurality of segments of the second housing portion.

According to certain further aspects, the contactor further includes at least one chamber actuator configured to selectively engage and disengage the first housing portion and the second housing portion with each other. According to this aspect, the at least one chamber actuator can be pneumatic. The contactor further includes a gas inlet configured to supply pressurized gas for actuating the at least one chamber actuator. According to this aspect, the pressurized gas for pressurizing the closed chamber and the pressurized gas for actuating the at least one chamber actuator can be from a same source.

According to certain further aspects, the contactor also includes a track configured to guide the device to and from the test site. A portion of the track constitutes a segment of the second housing portion. The contactor can include a first gasket configured to form a seal between the first housing portion and the portion of the track and a second gasket configured to form a seal between the portion of the track and a remainder of the second housing portion. The track can be arranged to guide the device to and from the test site based on gravity.

According to certain further aspects, the contactor further includes a gas outlet in fluid communication with the closed chamber. The contactor further includes a pressure sensor connected to the gas outlet. The pressure sensor is configured to control the pressurized gas supplied to the closed chamber for maintaining a set pressure in the closed chamber.

According to certain further aspects, the contactor further includes a cam actuator configured to actuate one or more cams. The contactor further includes a pair of shafts configured to provide alignment to the cam actuator to ensure linear force translation to the one or more cams.

According to certain further aspects, a system is disclosed. The system includes a contactor as described according to any of the of above aspects for applying a test voltage across a device. The system further includes a device test handler.

According to certain aspects of the present disclosure, a method of testing a breakdown voltage of a device is disclosed. The method includes providing the device at a test site. The test site includes a plurality of electrical contacts configured to make an electrical connection with the device. The method further includes engaging a first housing portion and a second housing portion to form a closed chamber, with the test site in the closed chamber. The method further includes pressurizing the closed chamber with a gas. The method further includes applying a test voltage across the device with the device in the pressurized chamber for isolation and breakdown testing. The method further includes disengaging the first housing portion from the second housing portion to open the closed chamber and release the pressurized gas after completion of the isolation and breakdown testing.

According to certain further aspects, the gas is continuously supplied for pressurizing the closed chamber, prior to the engaging the first housing portion engaging and the second housing portion to form the closed chamber.

According to certain further aspects, the device is provided at the test site by sliding down a track under the force of gravity until the device contacts a test ledge in a first position blocking the track.

According to certain further aspects, the method further includes removing the device from the test site, after the first housing portion and the second housing portion are disengaged, by actuating the test ledge into a second position.

According to certain further aspects, the engaging of the first housing portion and the second housing portion to form a closed chamber and the actuating of the one or more cams to cause the plurality of electrical contacts to make the electrical connection with the device occur simultaneously.

According to certain further aspects, the engaging of the first housing portion and the second housing portion to form a closed chamber and the actuating of the one or more cams to cause the plurality of electrical contacts to make the electrical connection with the device occur consecutively.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
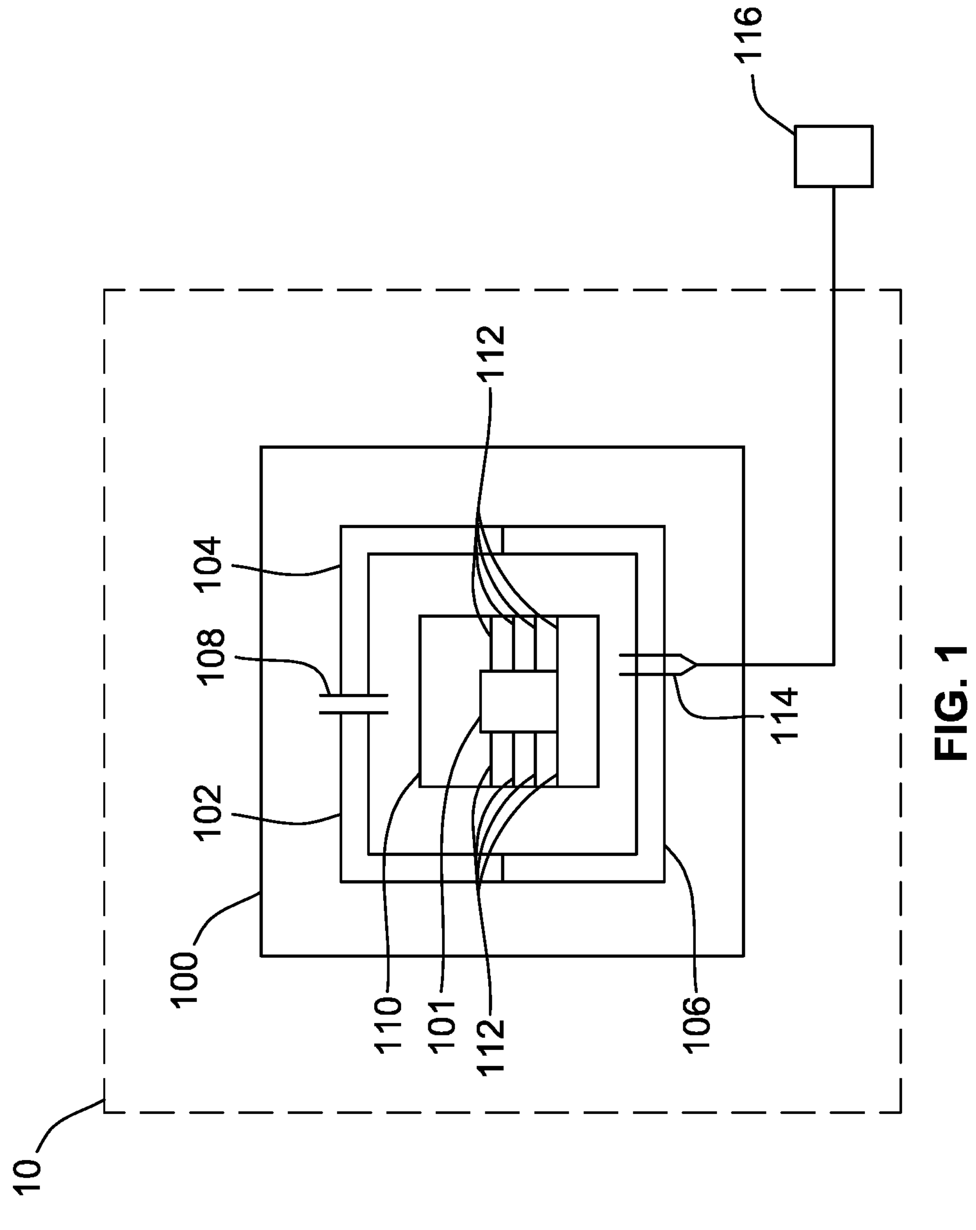
FIG. 1 is a block diagram of a contactor, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure is directed to a contactor used to test the breakdown voltage of devices, such as semiconductor devices. The contactor includes a housing that surrounds the device being tested at a test site. The housing can be closed to form a closed chamber, and the closed chamber can be pressurized such that the breakdown voltage of the device can be tested at a pressure higher than ambient pressure. Alternatively, the closed chamber can be de-pressurized (e.g., a vacuum or partial vacuum) such that the breakdown voltage of the device can be tested at a vacuum lower than ambient pressure. This allows the contactor to take advantage of Paschen's law during breakdown voltage testing.

FIG. 1 shows a block diagram of a contactor 100, according to aspects of the present disclosure. The contactor 100 is used to apply a voltage to a device 101, as discussed further below, for testing the breakdown voltage of the device 101. In contrast to conventional contactors, the contactor 100 includes a housing 102. The housing 102 is formed of a housing portion 104 (also referred to as a first housing portion 104) and a housing portion 106 (also referred to as a second housing portion 106). The housing portion 104 and the housing portion 106 are configured to selectively engage and disengage from each other. For example, the housing portion 104 can be movable relative to the fixed housing portion 106. Alternatively, the housing portion 104 can be fixed relative to the moveable housing portion 106. Even alternatively still, the housing portion 104 and the housing portion 106 can both be movable relative to the other components of the contactor 100.

When engaged, the housing portion 104 and the housing portion 106 cause the housing 102 to define a closed chamber. As discussed further below, the closed chamber formed by engagement of the housing portion 104 and the housing portion 106 can be pressurized relative to ambient pressure for testing the device 101. Alternatively, a vacuum or partial vacuum can be established relative t ambient pressure. Accordingly, the housing 102 includes a gas inlet 108. The gas inlet 108 is configured to supply pressurized gas into the housing 102. For example, the closed chamber can be pressurized up to about 2.5 Bar gauge (about 3.5 Bar absolute) via a supply of pressurized gas of about 3 Bar gauge through the gas inlet 108. Lower pressure operation can be maintained by lowering the feed pressure to about 0.5 Bar above the desired test pressure.

The contactor 100 further includes a test site 110 within the housing 102. The test site 110 is the location within the contactor 100 where the device 101 is tested by applying a voltage to the device 101. To apply the voltage, the contactor 100 includes one or more electrical contacts 112 at the test site 110. The electrical contacts 112 contact the device 101, such as electrical contacts of the device 101, for applying the voltage to the device 101.

The contactor 100 of the present disclosure is able to test the device 101 at an increased pressure (or decreased pressure) relative to ambient pressure to take advantage of Paschen's law discussed above. Specifically, the device 101 can be placed at the test site 110. Thereafter, the housing portion 104 and the housing portion 106 can make contact to form the closed chamber of the housing 102. Pressurized gas can then be supplied into the closed chamber through the gas inlet 108. After testing is finished, the housing portion 104 and the housing portion 106 can disengage to release the pressure and the device 101 can be removed from the test site 110. According to some implementations, the step of engaging the housing portion 104 and the housing portion 106 to form the closed chamber of the housing 102 can occur simultaneously with the step of making the electrical contact between the device 101 and the electrical contacts 112. Alternatively, the step of engaging the housing portion 104 and the housing portion 106 to form the closed chamber of the housing 102 can occur before or after the step of making the electrical contact between the device 101 and the electrical contacts 112.

According to some implementations, the contactor 100 can include a gas outlet 114. The gas outlet 114 can be connected to a pressure sensor 116. The gas outlet 114 and the pressure sensor 116 allow for determining what the pressure is inside the closed chamber when the housing portion 104 and the housing portion 106 are engaged. According to some implementations, the pressure sensor can be used to control the flow of pressurized gas into the chamber through the gas inlet 108. For example, once the desired pressure is reached inside the closed chamber, as determined by the pressure sensor 116, the pressure sensor 116 can cause the flow of pressurized gas inside of the chamber to stop. Alternatively, the pressure sensor 116 can be connected to gas inlet 108 and the contactor 100 may not include the gas outlet 114.

According to some implementations, the contactor 100 can be an element within an optional larger system 10 for testing or manufacturing devices, such as semiconductor devices. For example, the system 10 can be implemented directly into a test handler, such as a BSE Zeus Gravity handler manufactured by Boston Semi Equipment LLC. The test handler can feed individual devices into the contactor 100 and control a sequence of operations for conducting a high voltage breakdown test.

Figure 2:
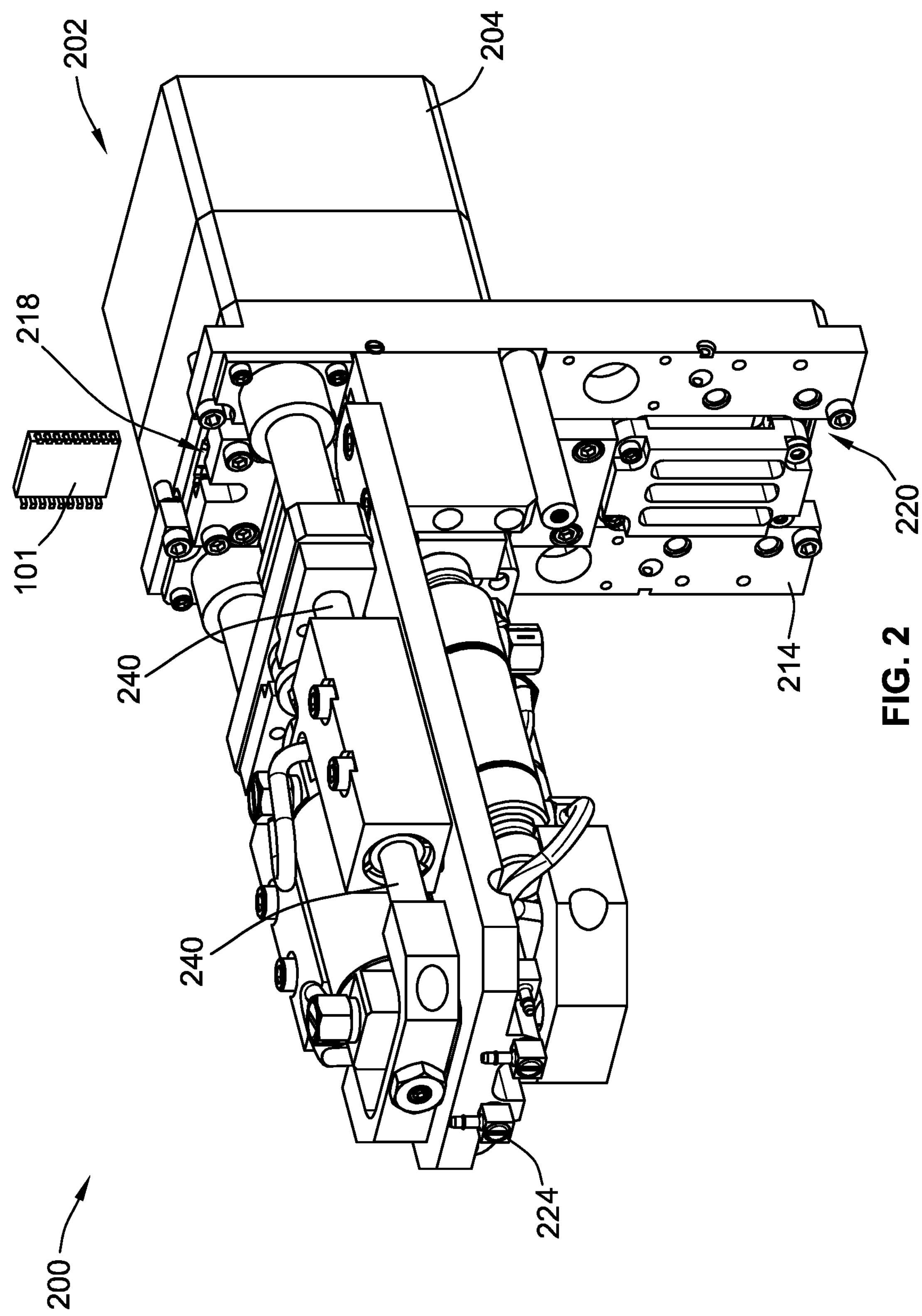
FIG. 2 is a perspective view of a contactor, according to aspects of the present disclosure.
Figure 3:
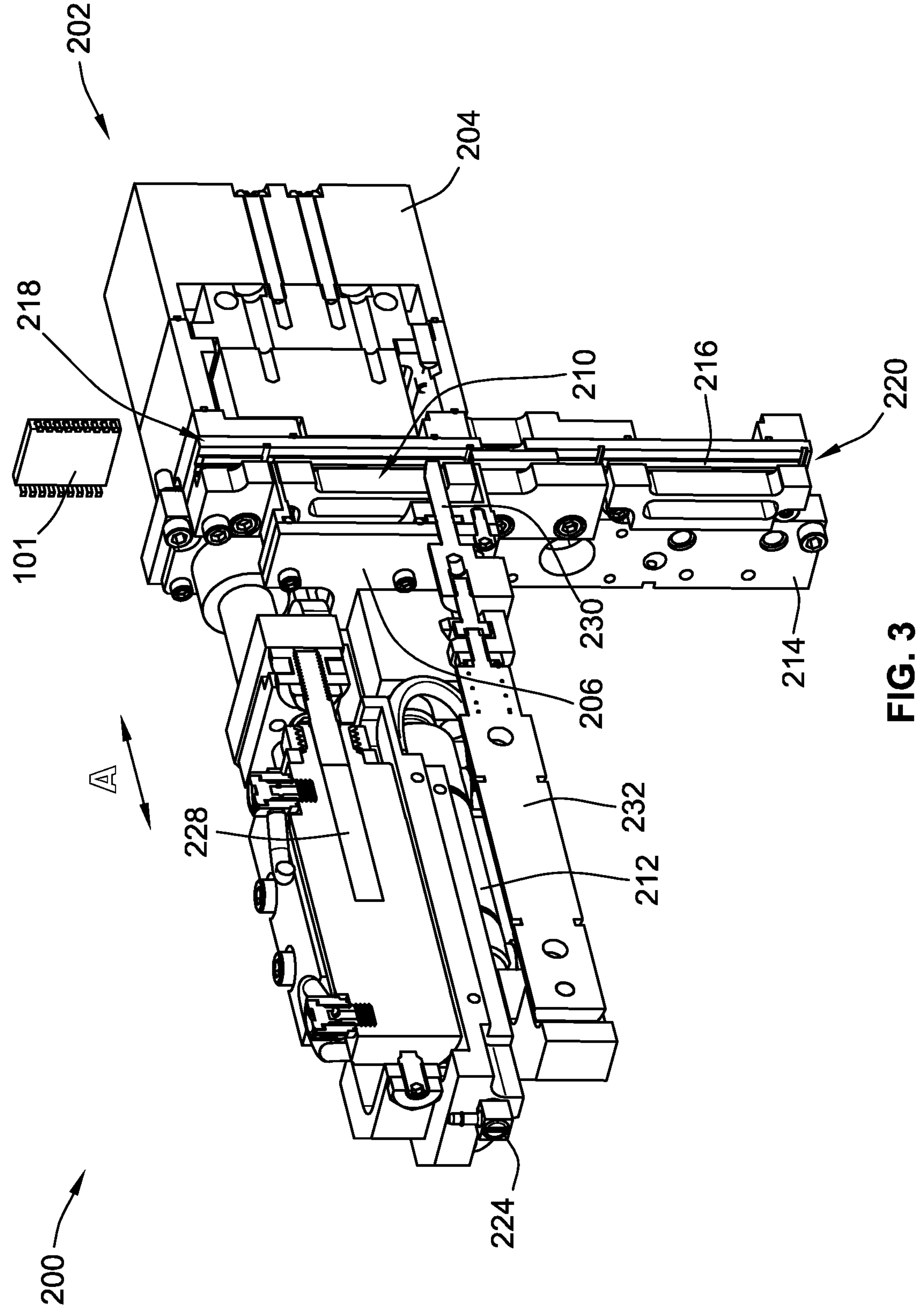
FIG. 3 is a cross-sectional perspective view of the contactor of FIG. 2, according to aspects of the present disclosure.

Referring to FIGS. 2 and 3, FIG. 2 shows a perspective view of a contactor 200, and FIG. 3 shows a cross-sectional perspective view of the contactor 200, according to aspects of the present disclosure. The contactor 200 is one example of an implementation of the contactor 100 of FIG. 1. Accordingly, the contactor 200 includes a housing 202. The housing 202 is formed of a housing portion 204 (also referred to as a first housing portion 204) and a housing portion 206 (also referred to as a second housing portion 206). The housing portion 204 and the housing portion 206 are configured to selectively engage and disengage from each other, as further discussed below.

When engaged, the housing portion 204 and the housing portion 206 cause the housing 202 to define a closed chamber. As discussed further below, the closed chamber formed by engagement of the housing portion 204 and the housing portion 206 can be pressurized relative to ambient pressure for testing a device, such as the device 101. Alternatively, the closed chamber can be de-pressurized relative to ambient pressure for testing a device.

The contactor 200 further includes a test site 210 within the housing 202. The test site 210 is the location within the contactor 200 where a device (e.g., device 101) is tested by applying a voltage to the device. As discussed further below, to apply the voltage the contactor 200 includes one or more electrical contacts (electrical contacts 652 in FIG. 6) at the test site 210. The electrical contacts contact a device for applying the voltage to the device.

The contactor 200 further includes a chamber actuator 212. The chamber actuator 212 is configured to selectively engage and disengage the housing portion 204 and the housing portion 206. For example, the chamber actuator 212 is connected to the housing portion 204 and configured to move the housing portion 204 toward and away from the housing portion 206 in the direction of arrow A so that the housing portion 204 and the housing portion 406 engage and disengage. The chamber actuator 212 can be pneumatically powered or electrically powered or the like. Although one chamber actuator 212 is shown in FIG. 2, the contactor 200 includes two chamber actuators 212, with the second one of the chamber actuators hidden behind other features of the contactor 202. However, both chamber actuators 212 are shown in, for example, FIG. 4B. Further, the contactor 200 can include one or more than two of the chamber actuators 212.

Figure 9:
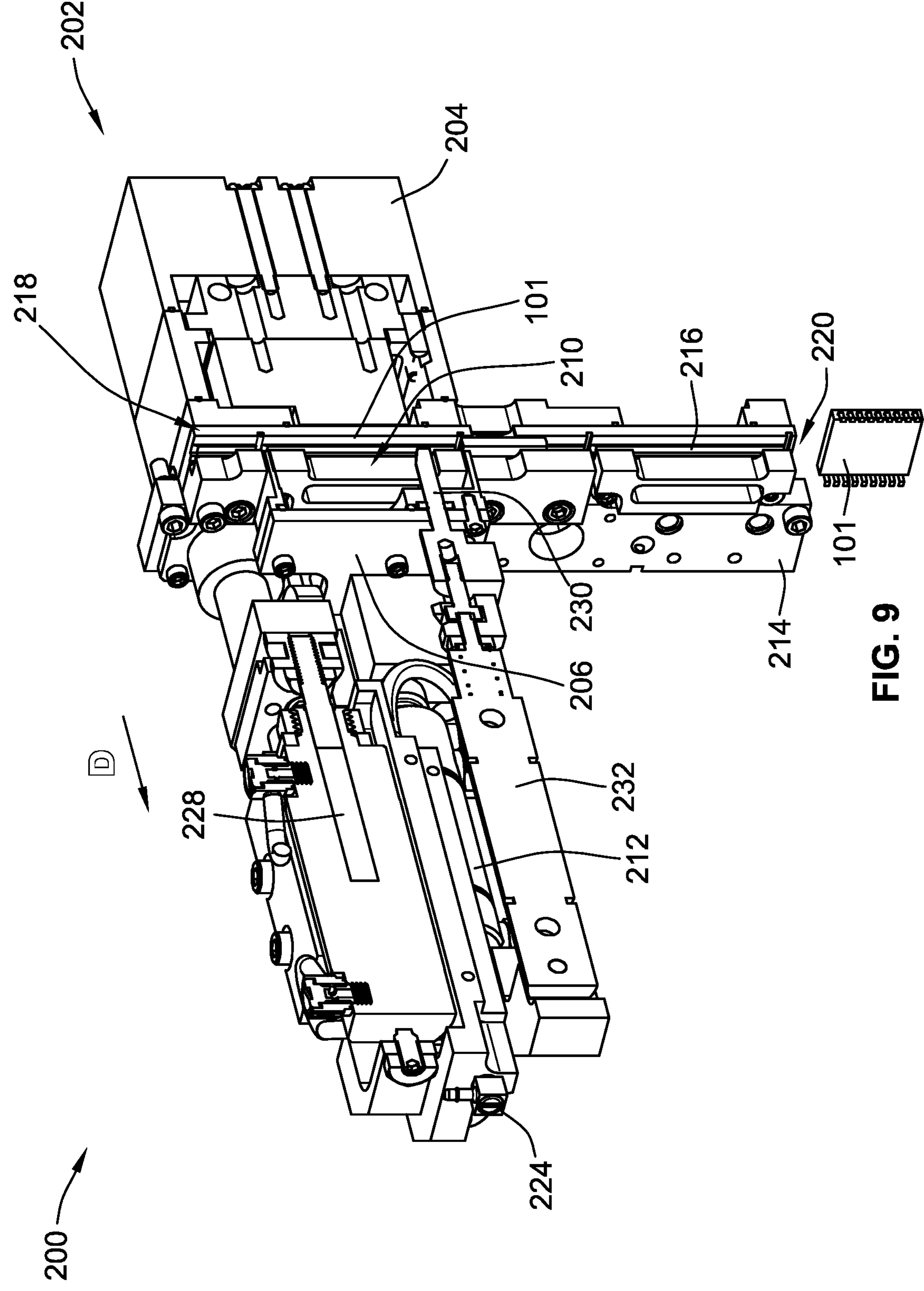
FIG. 9 is another cross-sectional perspective view of the contactor of FIG. 2, according to aspects of the present disclosure.

The contactor 200 further includes a support 214. The support 214 is a structure to which other elements of the contactor 200 can connect. The support 214 includes a track 216. The track 216 includes a track inlet 218 and a track outlet 220. The track 216 guides a device, such as a device 101, to the test site 210. More specifically, the track 216 guides a device 101, inputted at the track inlet 218 (FIG. 3), to the test site 210 under the force of gravity. After a test of the device 101 is completed, the track 216 guides the device 101 away from the test site 210 under the force of gravity and out at the track outlet 220 (FIG. 9).

The contactor 200 further includes a manifold 222. The manifold 222 is another structure to which other elements of the contactor 200 can connect. Further, the manifold 222 can route pressurized air to elements of the contactor 200 for powering actuation of the pneumatic elements. For example, according to some implementations, the manifold 222 can route pressurized air to the chamber actuators 212. The manifold 222 can include a pressurized air inlet 224 and a pressurized air outlet 226. Alternatively, in some implementations, the chamber actuators 212 can include a separate and distinct pressurized air inlets and/or air outlets.

Figure 6:
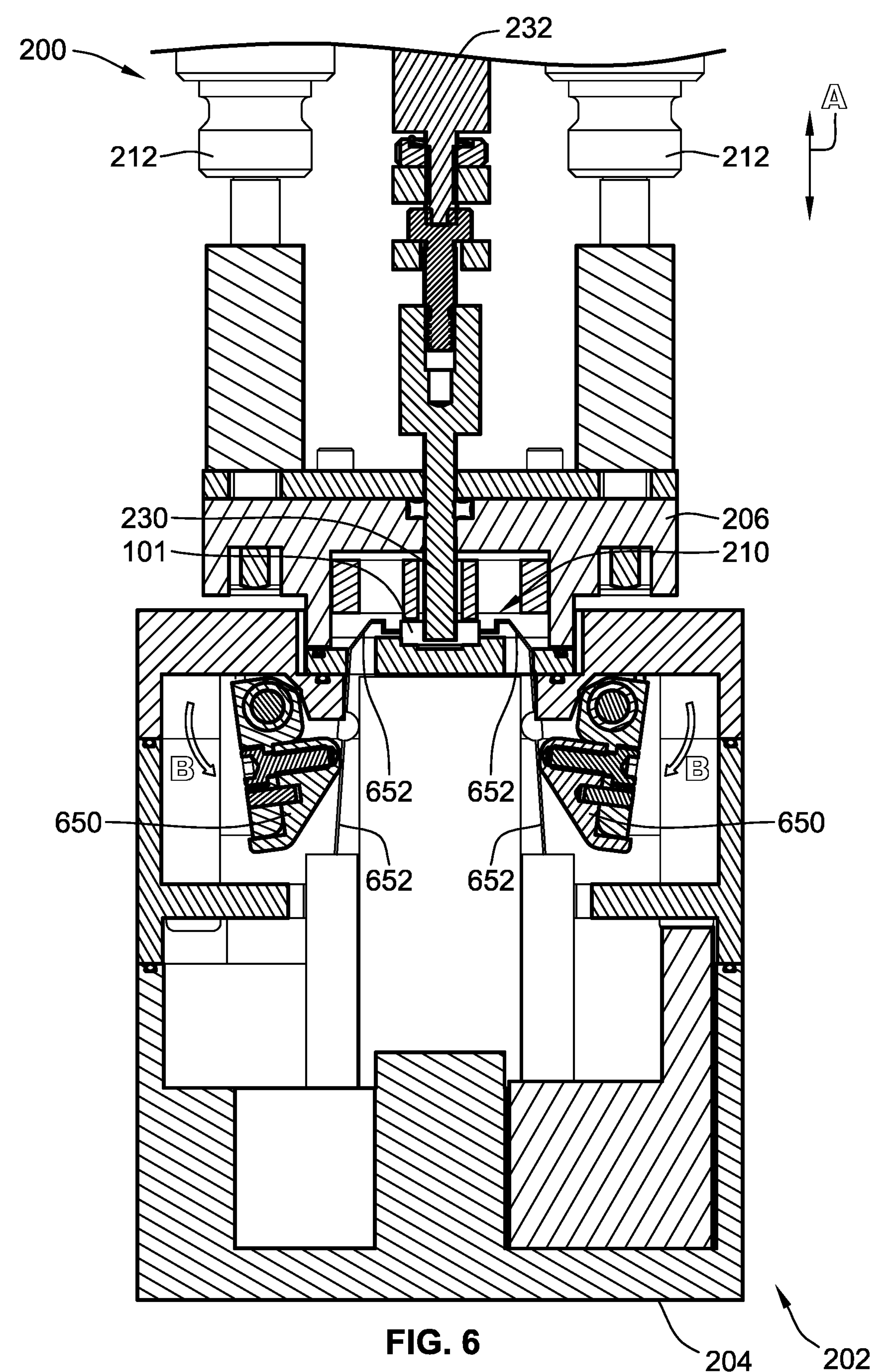
FIG. 6 is a partial cross-sectional view of the contactor of FIG. 5A along the line A-A in FIG. 5A, according to aspects of the present disclosure.
Figure 7:
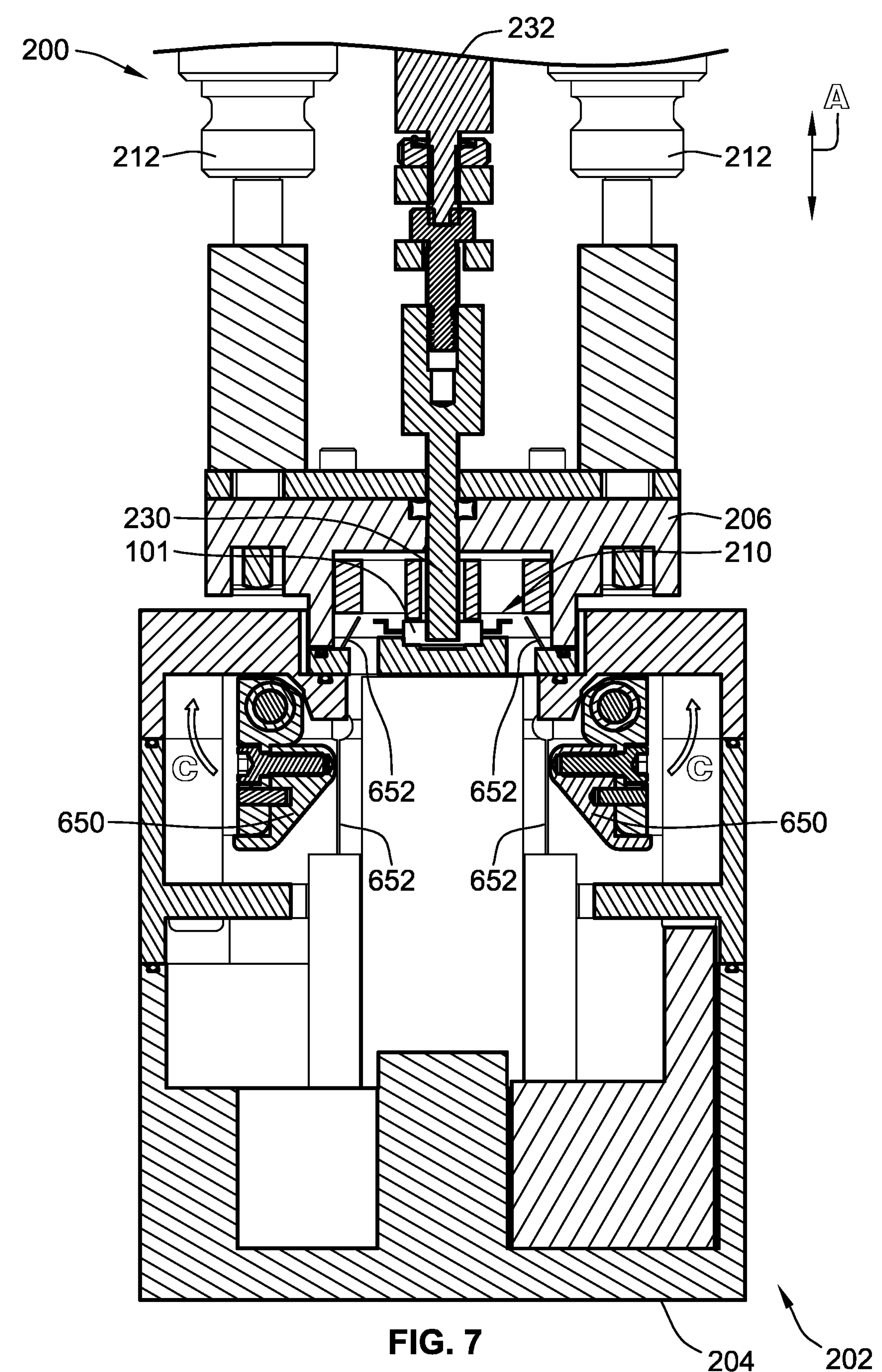
FIG. 7 is a partial cross-sectional view of the contactor of FIG. 5A along the line A-A in FIG. 5A, according to aspects of the present disclosure.

The contactor 200 further includes a cam actuator 228. The cam actuator 228 is configured to actuate one or more cams, as discussed further below (FIGS. 6 and 7). The cam actuator 228 can be pneumatically powered or electrically powered or the like. Although only one cam actuator 228 is shown and described, according to some implementations the contactor 200 can include more than one cam actuator 228.

The contactor 200 further includes a test ledge 230. The test ledge 230 is configured to retain a device (e.g., device 101) at the test site 210. The test ledge 230 is further configured to release the device from the test site 210 upon completion of a test. As such, the test ledge 230 is configured to move in the direction of arrow A. The test ledge 230 can be any structure that can hold and release a device as described, such as a rod. According to some embodiments, the position of the test ledge 230 can be adjusted without disassembling the contactor 200 and with the chamber intact.

The contactor 200 includes a test ledge actuator 232. The test ledge actuator 232 moves the test ledge 230 in the direction of arrow A to control retainment of a device at the test site 210. The test ledge actuator 232 can be pneumatically powered or electrically powered or the like. According to some implementations, the test ledge actuator 232 can be omitted where, for example, actuation of the test ledge 230 is incorporated into actuation of the cam actuator 228. Although only one test ledge actuator 232 is shown and described, according to some implementations the contactor 200 can include more than one test ledge actuator 232.

As shown in FIG. 2 in relation to FIG. 3, the cam actuator 228 (FIG. 3) rides along shafts 240 (FIG. 2). Although only one shaft 240 is visible in FIG. 2, there is a shaft 240 on the opposite side of the cam actuator 228, as shown in FIG. 5C (discussed below). The shafts 240 provide alignment to the cam actuator 228 to ensure linear force translation to one or more cams, as discussed further below (FIGS. 6 and 7). The shafts 240 can be formed of any material that provides stiffness to ensure proper force translation and testing accuracy. The shafts 240 also can include a coating to further improve testing accuracy. For example, the shafts 240 can be formed of aluminum and can be black anodized.

Figure 4A:
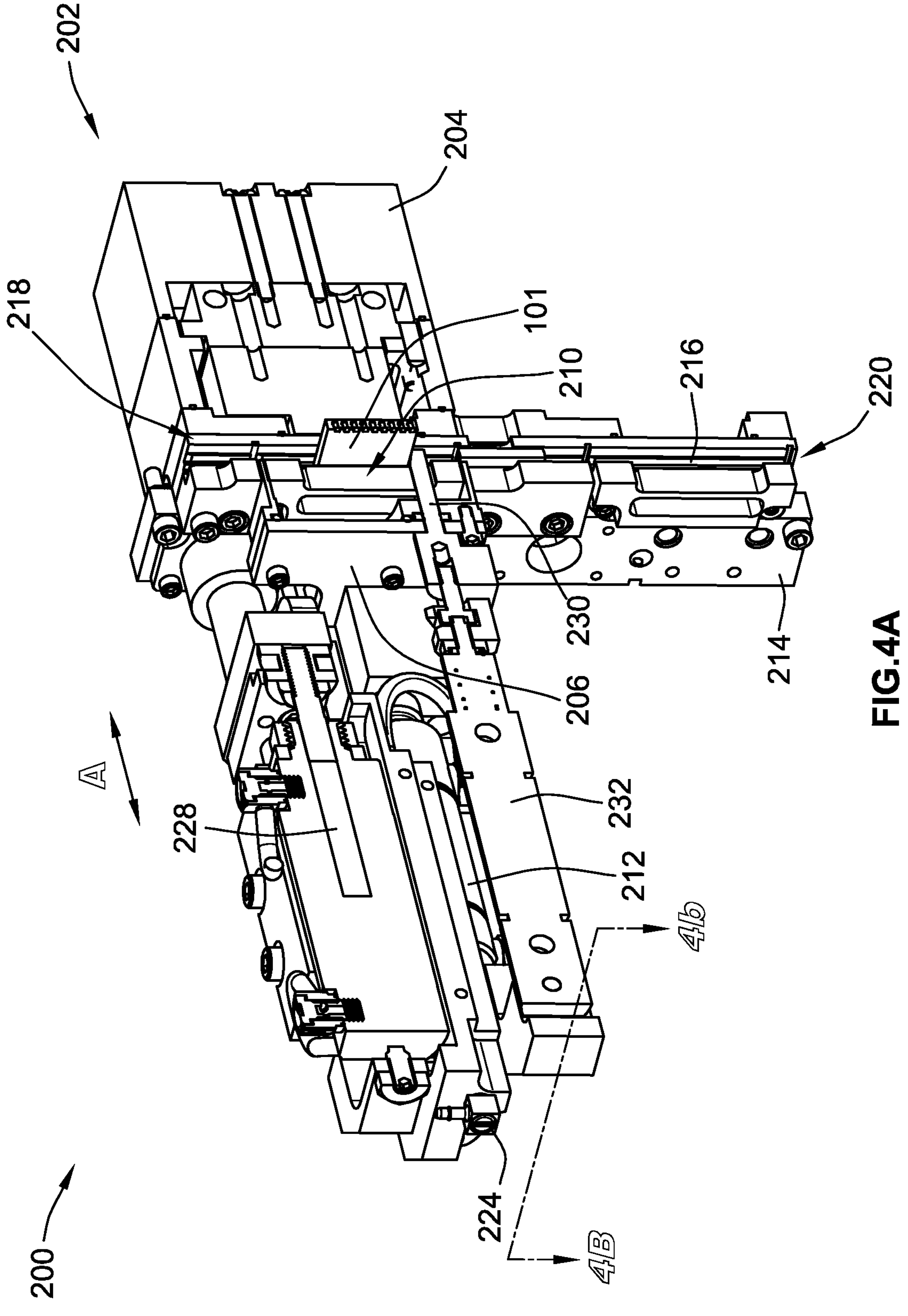
FIG. 4A is another cross-sectional perspective view of the contactor of FIG. 2, according to aspects of the present disclosure.
Figure 4B:
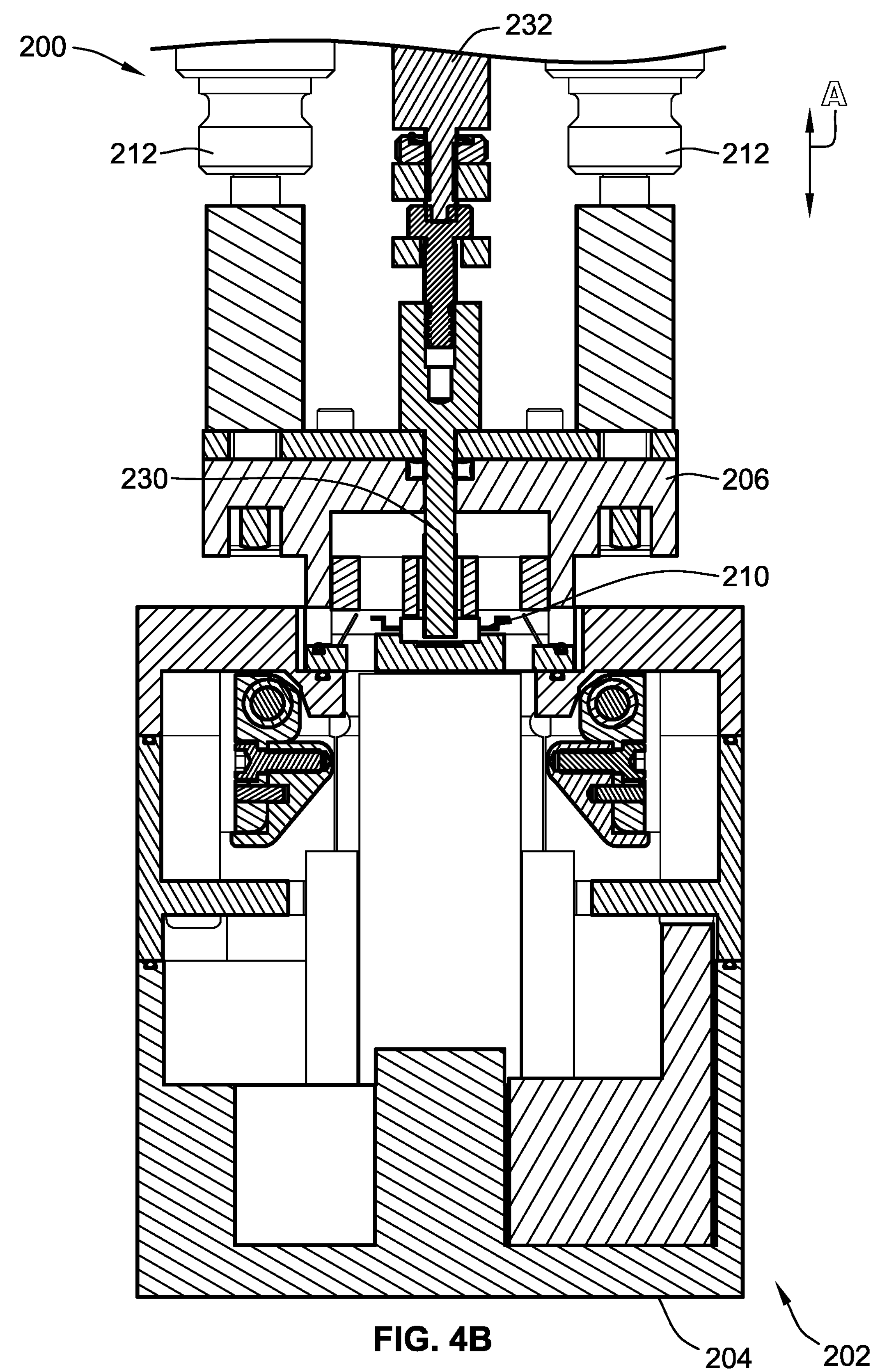
FIG. 4B is a partial cross-sectional view of the contactor of FIG. 4A along the line A-A in FIG. 4A, according to aspects of the present disclosure.

Reference will now be made to FIGS. 4A to 9 for describing the operation of the contactor 200, according to aspects of the present disclosure. Referring to FIGS. 4A and 4B, FIG. 4A shows a cross-sectional perspective view of the contactor 200 during operation, and FIG. 4B shows a partial cross-sectional perspective view of the contactor 200 along the line A-A in FIG. 4A. The device 101 is shown loaded into the contactor 200 and resting on the test ledge 230, with the test ledge 230 in an extended or closed position. The device 101 can be loaded into the contactor 200 via the track inlet 218 and allowed to slide down the track 216. At this point, the device 101 is at the test site 210 of the contactor 200.

Figure 5A:
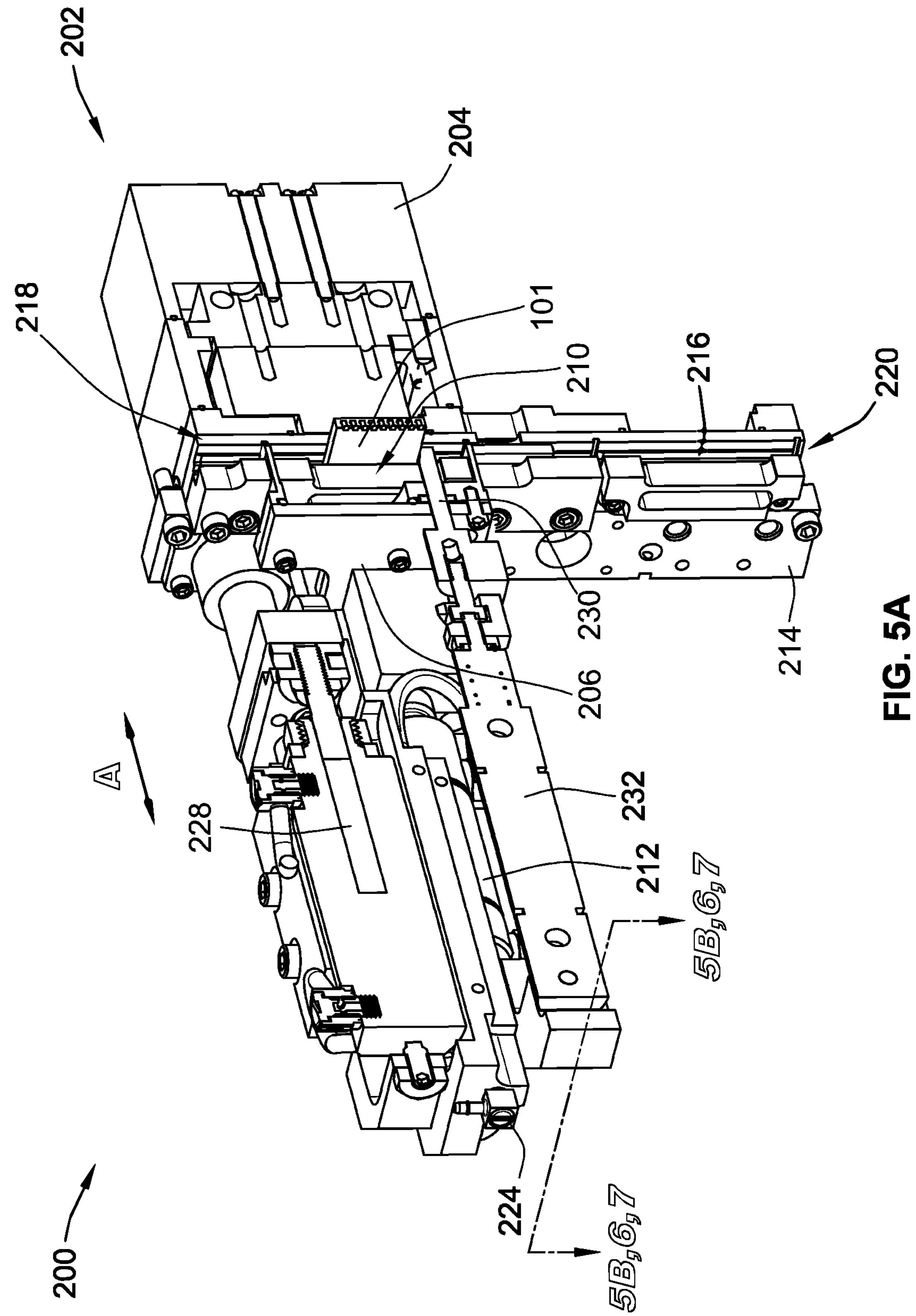
FIG. 5A is another cross-sectional perspective view of the contactor of FIG. 2, according to aspects of the present disclosure.
Figure 5B:
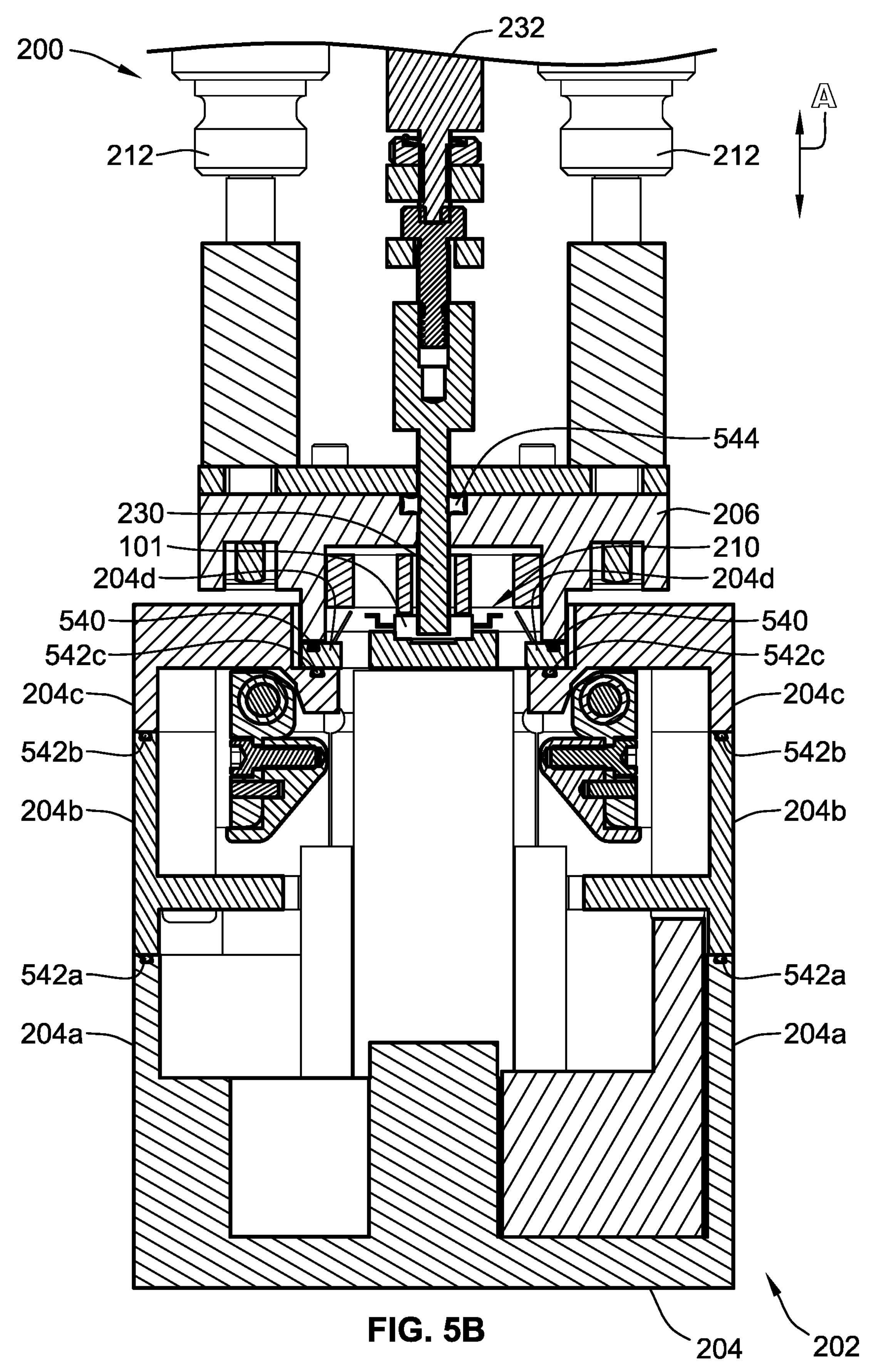
FIG. 5B is a partial cross-sectional view of the contactor of FIG. 5A along the line A-A in FIG. 5A, according to aspects of the present disclosure.
Figure 5C:
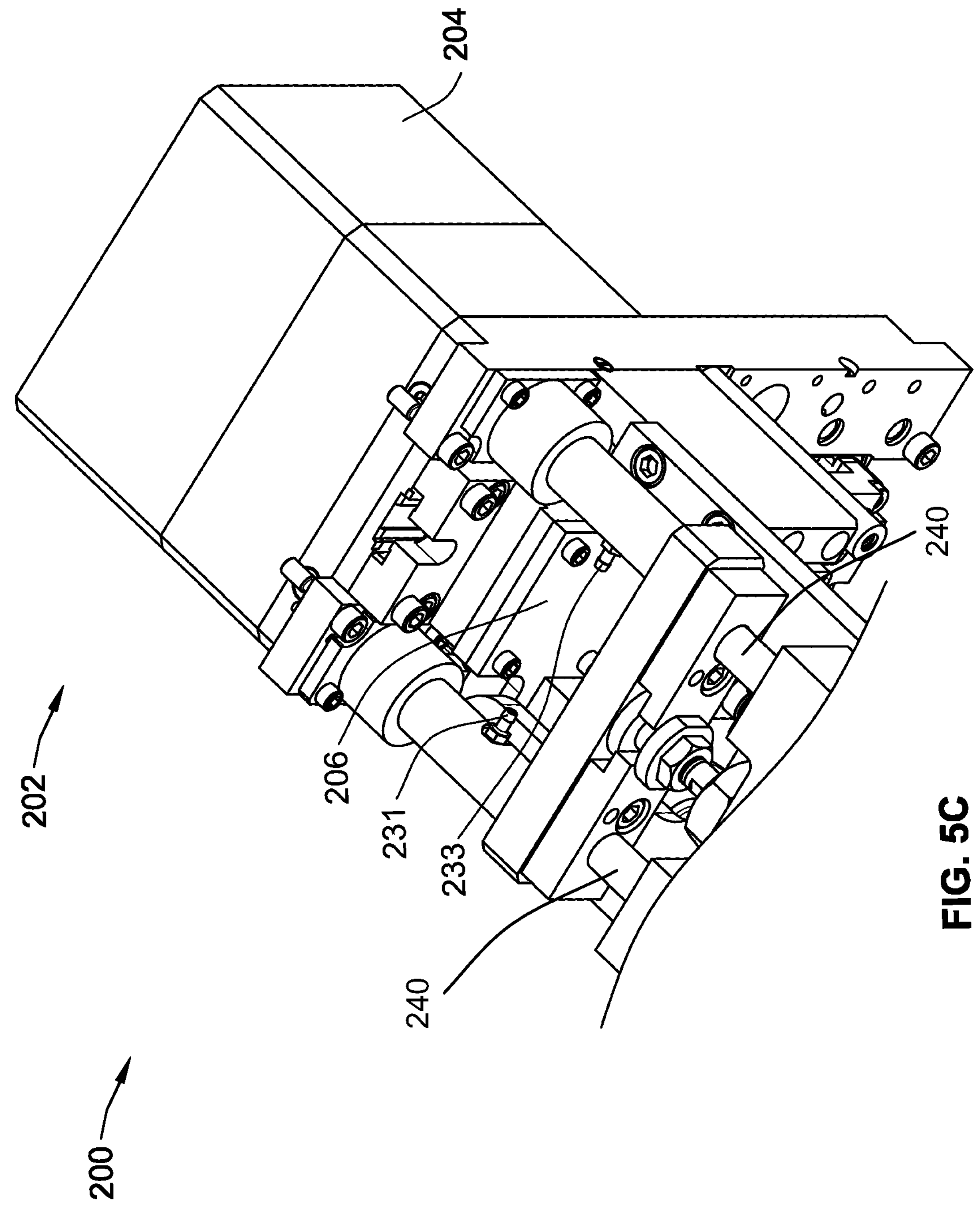
FIG. 5C shows a partial perspective view of the top of the contactor, according to aspects of the present disclosure.

Referring to FIGS. 5A-5C, FIG. 5A shows another cross-sectional perspective view of the contactor 200 during operation, FIG. 5B shows a partial cross-sectional perspective view of the contactor 200 along the line A-A in FIG. 5A, and FIG. 5C shows a partial perspective view of the top of the contactor 200, according to aspects of the present disclosure. The chamber actuators 212 actuate to cause the housing portion 206 to translate in the direction of arrow A toward the housing portion 204 so as to engage with the housing portion 204. This forms a closed chamber from the housing 202. According to some implementations, one or both of the housing portion 204 and the housing portion 206 can be made out of a flexible material such that the housing portion 204 and the housing portion 206 form a sealed interface that prevents or limits pressurized gas from escaping. Alternatively, and referring specifically to FIG. 5B, a gasket 540 is between and at entire interface of the housing portion 204 and the housing portion 206. The gasket 540 forms a seal such that pressurized air within the closed chamber is limited or prevented from escaping, which allows the closed chamber to be pressurized relative to ambient pressure.

Still referring to FIG. 5B, the housing portion 204 can be formed of a plurality of housing portion segments 204_a_-204_d_. The housing portion 204 being formed of the housing portion segments 204_a_-204_d_ can make assembly of the contactor 200 easier. To maintain the pressurized closed chamber, the housing portion 204 can include a plurality of gaskets 542_a_-542_c_. Each of the gaskets 542_a_-542_c_ is configured to form a seal between adjacent pairs of the housing portion segments 204_a_-204_d_. For example, the gasket 542_a_ forms a seal between adjacent housing portion segments 204_a_ and 204_b_, the gasket 542_b_ forms a seal between adjacent housing portion segments 204_b_ and 204_c_, and the gasket 542_c_ forms a seal between adjacent housing portion segments 204_c_ and 204_d_. Further, although the housing portion segment 204_d_ is disclosed as being part of the housing portion 204, according to some implementations the housing portion segment 204_d_ can also be considered part of the track 216.

The contactor 200 includes a gasket 544 located where the test ledge 230 extends through the housing portion 206. The gasket 544 is between the test ledge 230 and the housing portion 204 to limit or precent pressurized gas from escaping between the test ledge 230 and the housing portion 206. The gasket 544 can take the shape of the test ledge 230, such as being in the shape of a ring if the test ledge 230 is tubular.

Alternatively, the gasket 544 can take the shape of whatever geometry the test ledge 230 and an opening of the housing portion 204 through which the test ledge 230 extends.

Referring to FIG. 5C, the contactor 200 can include a gas inlet 231. Similar to the gas inlet 108 of FIG. 1, the gas inlet 231 is configured to supply pressurized gas into the housing 202 for pressurizing the closed chamber when the housing portion 204 and the housing portion 206 are engaged. Thus, although not specifically shown, the gas inlet 231 can be fluidly connected internally to the interior of the housing 202. The pressurized gas can be constantly supplied through the gas inlet 231, such as both when the housing portion 204 is engaged with and disengaged with the housing portion 206. Alternatively, the pressurized gas can be supplied only when the housing portion 204 becomes engaged with the housing portion 206.

The contactor 200 can further include a gas outlet 233. According to some implementations, the gas outlet 233 can be connected to a pressure sensor (FIG. 1) for determining the pressure within the housing 202 when the housing portion 204 and the housing portion 206 are engaged. For example, the pressure sensor can be used to determine when the pressure within the closed chamber is at the predetermined pressure required for the breakdown voltage testing. The pressure sensor further can control the supply of the pressurized gas to the closed chamber for maintaining a set pressure in the closed chamber. According to some implementations, the pressure within the chamber can also be released through the gas outlet 233, alone or in combination with disengaging the housing portion 204 and the housing portion 206, the latter being discussed further below. According to some implementations, the supply of the pressurized gas can instead be from the manifold 222 rather than from the separate and distinct gas inlet.

Referring to FIG. 6, shown is a partial cross-sectional perspective view of the contactor 200 still along the line A-A in FIG. 5A but further updated based on an additional step, according to aspects of the present disclosure. After the housing portion 204 engages the housing portion 206, and the closed chamber formed by the closed housing 202 is pressurized, cams 650 actuate based on operation of the cam actuator 228 (FIG. 3). The cams 650 actuate by rotating in the direction of arrows B in FIG. 6. Actuation of the cams 650 causes electrical contacts 652 (e.g., electrical contacts 112) to flex inward toward the device 101 at the test site 210. The electrical contacts 652 form an electrical connection with the device 101. Thereafter, a breakdown voltage test can be performed on the device 101. Because the device 101 is at the test site 210 within the closed chamber formed by the housing 202, which is pressurized, the breakdown voltage test has the benefit described above of Paschen's law.

Although shown and described as being two separate steps, according to some implementations, the step shown in FIGS. 5A-5C can be performed at the same time as the step shown in FIG. 6. Namely, the cams 650 can actuate to make an electrical connection between the device 101 and the electrical contacts 652 at the same time the housing portion 204 engages the housing portion 206. Alternatively, the order of the step shown in FIGS. 5A-5C and the step shown in FIG. 6 can be reversed. Specifically, the cams 650 can actuate to make an electrical connection between the device 101 and the electrical contacts 652 before the housing portion 204 engages the housing portion 206.

Referring to FIG. 7, shown is a partial cross-sectional perspective view of the contactor 200 still along the line A-A in FIG. 5A but further updated based on an additional step, according to aspects of the present disclosure. After the breakdown test has concluded, the cams 650 can be actuated back in the direction of arrows C. This causes the electrical contacts 652 to flex away from the device 101, which electrically disconnects the device 101 from the electrical contacts 652.

Figure 8A:
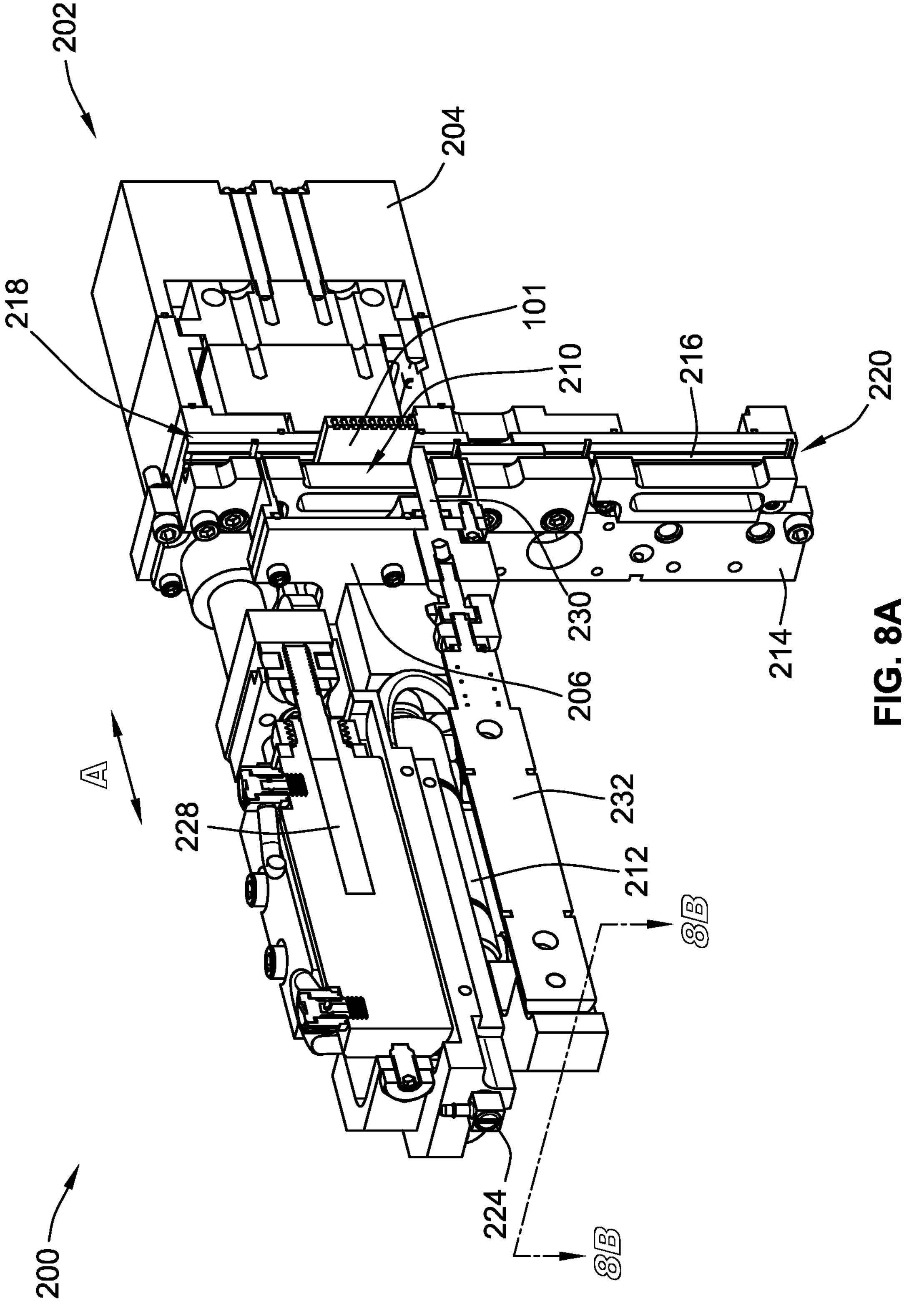
FIG. 8A is another cross-sectional perspective view of the contactor of FIG. 2, according to aspects of the present disclosure.
Figure 8B:
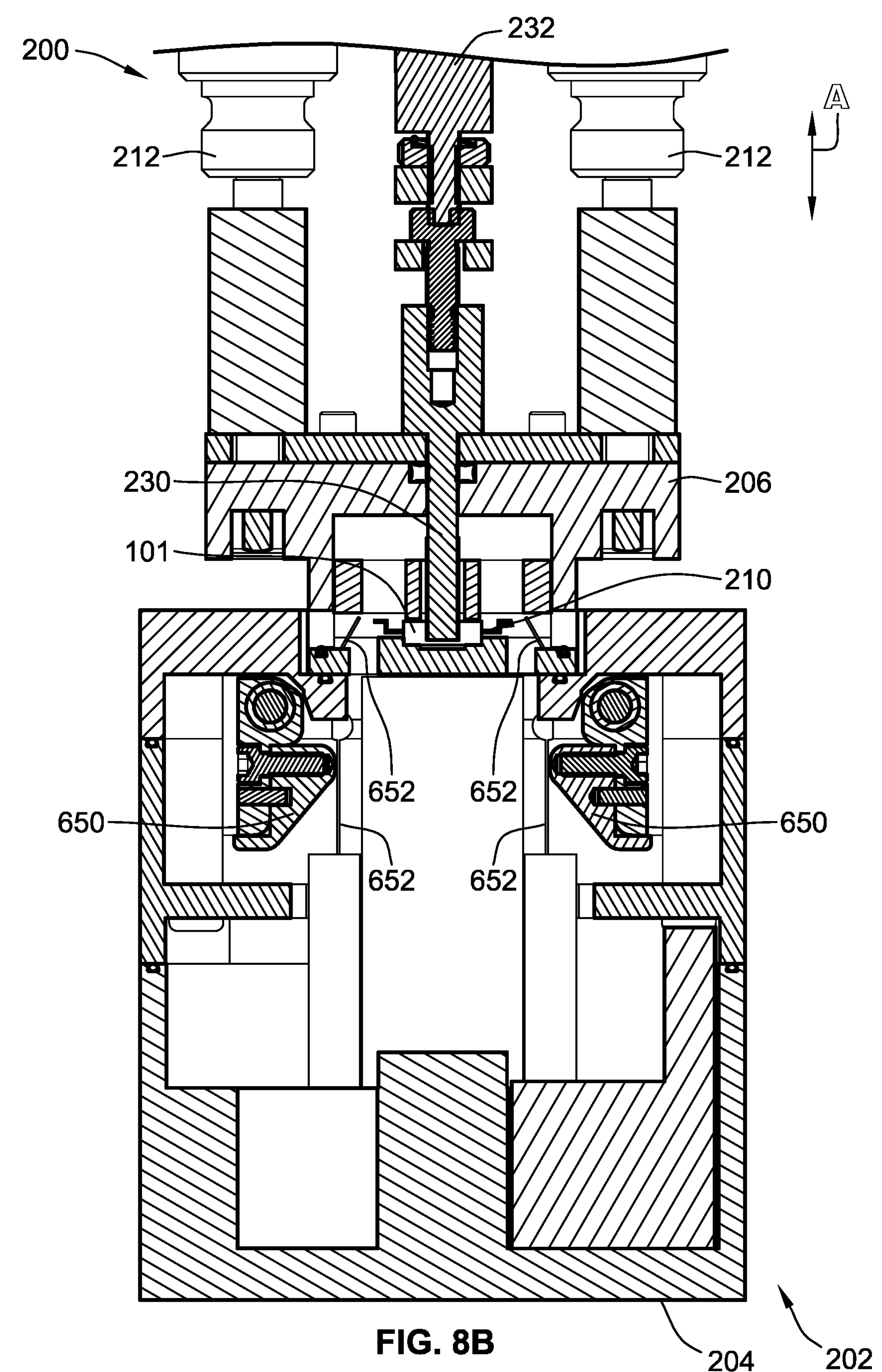
FIG. 8B is a partial cross-sectional view of the contactor of FIG. 8A along the line A-A in FIG. 8A, according to aspects of the present disclosure.

Referring to FIGS. 8A and 8B, FIG. 8A shows another cross-sectional perspective view of the contactor 200 during operation, and FIG. 8B shows a partial cross-sectional perspective view of the contactor 200 along the line B-B in FIG. 8A. After the electrical contacts 652 have flexed away from the device 101, the housing portion 206 can disengage from the housing portion 206. Disengaging the housing portion 206 from the housing portion 204 releases the pressure within the chamber formed by the closed housing 202. The housing portion 206 disengages from the housing portion 204 based on the chamber actuators 212 actuating in the direction of the arrow A opposite from before.

Similar to before, although shown and described as being two separate steps, according to some implementations, the step shown in FIGS. 8A and 8B can be performed at the same time as the step shown in FIG. 7. Namely, the cams 650 can actuate to disconnect the electrical connection between the device 101 and the electrical contacts 652 at the same time the housing portion 204 disengages from the housing portion 206. Alternatively, the order of the step shown in FIGS. 8A and 8B and the step shown in FIG. 7 can be reversed. Specifically, the cams 650 can actuate to disconnect the electrical connection between the device 101 and the electrical contacts 652 before the housing portion 204 disengages the housing portion 206.

Referring to FIG. 9, shown is another cross-sectional perspective view of the contactor 200 during operation, according to aspects of the present disclosure. The test ledge 230 is actuated into the retracted or open position by translating in in the direction of arrow D. The test ledge 230 is actuated in the direction of arrow D based on the test ledge actuator 232. Once the test ledge 230 is in the retracted or open position, the device 101 is allowed to exit the test site 210 based on the force of gravity and travel down the track 216 to the track outlet 220. From the track outlet 220, the device 101 may be carried or transported to another apparatus.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A contactor for applying a test voltage across a device, the contactor comprising:

a test site including a plurality of electrical contacts configured to make an electrical connection with the device when the device is positioned at the test site;

a housing including a first housing portion and a second housing portion, the first housing portion and the second housing portion being configured to selectively engage and disengage from each other, the first housing portion and the second housing portion defining a closed chamber when engaged, the test site being within the closed chamber;

a gas inlet configured to supply pressurized gas for pressurizing the closed chamber when the first housing portion and the second housing portion are engaged;

a track configured to guide the device to and from the test site, a portion of the track constituting a segment of the first housing portion;

a first gasket configured to form a seal between the portion of the track and a remainder of the first housing portion; and a second gasket configured to form a seal between the portion of the track and the second housing portion.

2. The contactor of claim 1, wherein the first housing portion and the second housing portion are made of a material that is inflexible, the contactor further comprising:

a gasket configured to form a seal between the first housing portion and the second housing portion when engaged with each other.

3. The contactor of claim 1, further comprising:

a test ledge configured to actuate between a first position, configured to hold the device at the test site, and a second position, configured to release the device from the test site, the test ledge extending through one of the first housing portion or the second housing portion; and a gasket configured to form a seal between the test ledge and the one of the first housing portion or the second housing portion that the test ledge extends through.

4. The contactor of claim 1, wherein the first housing portion includes a plurality of segments, the contactor further comprising:

one or more gaskets, each gasket of the one or more gaskets configured to form a seal between an adjacent pair of the plurality of segments of the first housing portion.

5. The contactor of claim 1, further comprising:

at least one chamber actuator configured to selectively engage and disengage the first housing portion and the second housing portion with each other.

6. The contactor of claim 5, wherein the at least one chamber actuator is pneumatic, the contactor further comprising a gas inlet configured to supply pressurized gas for actuating the at least one chamber actuator.

7. The contactor of claim 6, wherein the pressurized gas for pressurizing the closed chamber and the pressurized gas for actuating the at least one chamber actuator are from a same source.

8. The contactor of claim 1, wherein the track is arranged to guide the device to and from the test site based on gravity.

9. The contactor of claim 1, further comprising:

a gas outlet in fluid communication with the closed chamber; and a pressure sensor connected to the gas outlet, the pressure sensor being configured to control supply of the pressurized gas to the closed chamber for maintaining a set pressure in the closed chamber.

10. The contactor of claim 1, further comprising:

a cam actuator configured to actuate one or more cams; and a pair of shafts configured to provide alignment to the cam actuator to ensure linear force translation to the one or more cams.

11. A system comprising:

a contactor for applying a test voltage across a device, the contactor including:

a test site including a plurality of electrical contacts configured to make an electrical connection with the device when the device is positioned at the test site;

a housing including a first housing portion and a second housing portion, the first housing portion and the second housing portion being configured to selectively engage and disengage from each other, the first housing portion and the second housing portion defining a closed chamber when engaged, the test site being within the closed chamber;

a gas inlet configured to supply pressurized gas for pressurizing the closed chamber when the first housing portion and the second housing portion are engaged;

a track configured to guide the device to and from the test site, a portion of the track constituting a segment of the first housing portion;

a first gasket configured to form a seal between the portion of the track and a remainder of the first housing portion; and a second gasket configured to form a seal between the portion of the track and the second housing portion; and a device test handler for feeding the device into the contactor.

12. The system of claim 11, wherein the track is arranged to guide the device to and from the test site based on gravity.

13. A method of testing a breakdown voltage of a device, the method comprising:

guiding the device down a track to a test site, the test site including a plurality of electrical contacts configured to make an electrical connection with the device;

engaging a first housing portion and a second housing portion to form a closed chamber, the test site being within the closed chamber;

pressurizing the closed chamber with a gas;

applying a test voltage across the device with the device in the pressurized closed chamber for isolation and breakdown testing;

disengaging the first housing portion from the second housing portion to open the closed chamber and release the pressurized gas after completion of the isolation and breakdown testing; and guiding the device down the track away from the test site, wherein a portion of the track constitutes a segment of the first housing portion;

wherein a first gasket is positioned between the portion of the track and a remainder of the first housing portion to form a seal therebetween; and a second gasket is positioned between the portion of the track and the second housing portion to form a seal therebetween.

14. The method of claim 13, wherein the gas is continuously supplied for pressurizing the closed chamber, prior to the engaging the first housing portion engaging and the second housing portion to form the closed chamber.

15. The method of claim 13, wherein the device is provided at the test site by sliding down the track via gravity until the device contacts a test ledge in a first position blocking the track.

16. The method of claim 15, further comprising: removing the device from the test site, after the first housing portion and the second housing portion are disengaged, by actuating the test ledge into a second position.

17. The method of claim 13, further comprising: actuating one or more cams to cause the plurality of electrical contacts to make the electrical connection with the device when the device is positioned at the test site.

18. The method of claim 17, wherein the engaging the first housing portion and the second housing portion to form the closed chamber and the actuating the one or more cams to cause the plurality of electrical contacts to make the electrical connection with the device occur simultaneously.

19. The method of claim 17, wherein the engaging the first housing portion and the second housing portion to form the closed chamber and the actuating the one or more cams to cause the plurality of electrical contacts to make the electrical connection with the device occur consecutively.

* * * * *